(12) United States Patent
Haji et al.

(10) Patent No.: US 6,683,379 B2
(45) Date of Patent: Jan. 27, 2004

(54) SEMICONDUCTOR DEVICE WITH REINFORCING RESIN LAYER

(75) Inventors: Hiroshi Haji, Chikushino (JP); Shoji Sakemi, Ogoori (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/042,263

(22) Filed: Jan. 11, 2002

(65) Prior Publication Data

US 2002/0061642 A1 May 23, 2002

Related U.S. Application Data

(62) Division of application No. 09/645,408, filed on Aug. 25, 2000, now Pat. No. 6,350,664.

(30) Foreign Application Priority Data

Sep. 2, 1999 (JP) .............................. 11-248360

(51) Int. Cl.[7] .................... H01L 23/48; H01L 23/52; H01L 29/40
(52) U.S. Cl. ............... 257/729; 257/787; 257/737; 257/738; 257/778; 257/783; 257/718; 257/782; 257/786; 257/673; 257/780; 348/106; 348/102; 348/460; 348/612
(58) Field of Search ................. 257/729, 777, 257/786, 787–791, 690, 692, 693, 734, 737, 738, 778, 783, 781, 795, 782, 780; 348/106, 107, 460, 612

(56) References Cited

U.S. PATENT DOCUMENTS

| 4,043,027 A | 8/1977 | Birchier et al. ............. 28/588 |
|---|---|---|
| 4,891,334 A | 1/1990 | Satoh et al. ................ 437/228 |
| 5,324,687 A | 6/1994 | Wojnarowski ............... 437/225 |
| 5,643,483 A | * 7/1997 | Kubota et al. .............. 219/543 |
| 5,677,575 A | * 10/1997 | Maeta et al. ................ 257/778 |
| 5,747,101 A | * 5/1998 | Booth et al. ................... 427/96 |
| 5,870,289 A | * 2/1999 | Tokuda et al. .............. 361/779 |
| 5,892,288 A | * 4/1999 | Muraki et al. .............. 257/778 |
| 5,920,770 A | * 7/1999 | Yasunaga et al. ........... 438/124 |
| 5,960,538 A | * 10/1999 | Kawakita et al. ............. 29/847 |
| 6,108,210 A | * 8/2000 | Chung ........................ 257/737 |
| 6,130,116 A | 10/2000 | Smith et al. ................ 438/127 |
| 6,184,064 B1 | 2/2001 | Jiang et al. ................. 438/113 |
| 6,190,946 B1 | 2/2001 | Shin .......................... 438/123 |
| 6,197,616 B1 | 3/2001 | Hyuodo et al. ............. 438/113 |
| 6,204,091 B1 | 3/2001 | Smith et al. ................ 438/108 |
| 6,221,751 B1 | 4/2001 | Chen et al. ................. 438/612 |
| 6,278,192 B1 | * 8/2001 | Takigawa et al. ........... 257/787 |
| 6,300,576 B1 | * 10/2001 | Nakamura et al. .......... 174/261 |

(List continued on next page.)

FOREIGN PATENT DOCUMENTS

| EP | 0 203 591 B1 | 7/1992 | ......... H01L/21/302 |
|---|---|---|---|
| EP | 0 913 858 A1 | 5/1999 | ......... H01L/21/304 |
| EP | 1 154 474 A1 | 11/2001 | ......... H01L/23/12 |
| GB | 2 322 737 A | 9/1998 | ......... H01L/21/304 |
| JP | 61-283130 | 12/1986 | ......... H01L/21/304 |
| JP | 05-055278 | 3/1993 | ......... H01L/21/56 |
| JP | 8-316194 | 11/1996 | |
| KR | 9506946 B1 | * 12/1991 | |

*Primary Examiner*—Alexander O. Williams
(74) *Attorney, Agent, or Firm*—Parkhurst & Wendel, L.L.P.

(57) ABSTRACT

A semiconductor device including a semiconductor substrate having a thickness of not more than 300 μm and a resin layer formed on a face thereof. A plurality of conductor sections formed in and through the resin layer, and a plurality of electrodes located on the resin layer and connected by the conductor sections to electrodes of semiconductor elements located on the substrate. The resin layer includes at least one of silica, alumina, zirconia, quartz fiber, glass fiber resin fiber and inorganic particles capable of absorbing ionic impurities.

5 Claims, 6 Drawing Sheets

U.S. PATENT DOCUMENTS

| | | | | |
|---|---|---|---|---|
| 6,300,686 B1 | * | 10/2001 | Hirano et al. | 257/783 |
| 6,306,682 B1 | * | 10/2001 | Huang et al. | 438/107 |
| 6,365,432 B1 | * | 4/2002 | Fukutomi et al. | 438/106 |
| 6,434,017 B1 | * | 8/2002 | Iwabuchi | 361/771 |
| 6,486,006 B2 | * | 11/2002 | Hirano et al. | 438/125 |
| 2002/0027257 A1 | * | 3/2002 | Kinsman et al. | 257/400 |
| 2002/0041009 A1 | * | 4/2002 | Yamaguchi et al. | 257/664 |
| 2002/0102831 A1 | * | 8/2002 | Hui et al. | 438/611 |
| 2003/0003287 A1 | * | 1/2003 | Tobita | 428/297.4 |

* cited by examiner

SEMICONDUCTOR DEVICE WITH REINFORCING RESIN LAYER

This is a application is a divisional of application Ser. No. 09/645,408 filed Aug. 25, 2000 now U.S. Pat. No. 6,350,664 B1.

FIELD OF THE INVENTION

The present invention relates to semiconductor devices and production methods of the same in which electrodes for external connection disposed on semiconductor elements having conductive sections formed thereon.

BACKGROUND OF THE INVENTION

The present invention relates to semiconductor devices and production methods for making same in which semiconductor elements having conductive sections including electrodes for external connection formed thereon.

With recent downsizing of electronic devices, semiconductor devices have been becoming even smaller. Special focus has been put on the effort to make semiconductor elements as thin as possible. Thinly machined semiconductor wafers are divided into pieces whereby each has a semiconductor element mounted thereon, and sent individually to a packaging process. Conventionally, prior to the thinning process, in order to enhance their strength of wafers, the wafers are attached to a protective sheet on which pressure sensitive adhesives is coated. After this process, the tackiness of the pressure sensitive adhesives is reduced, and then thinned wafers are removed from the protective sheet.

The thinned semiconductor wafers are, however, vulnerable to external force, thus they can easily be damaged during removal of the protective sheet. Even when the protective sheet is removed without causing any damage, the semiconductor elements tend to suffer problems such as heat cracks generated by thermal stress while they are encapsulated with resin. Thus, it has been difficult to secure reliability of the product. The protective sheets used in the conventional method are consumables and thrown away after one use. This increases waste. As such, the conventional method is not desirable in terms of cost and environmental protection.

The present invention aims at providing highly reliable semiconductor devices and methods of manufacturing the same.

SUMMARY OF THE INVENTION

The method of manufacturing a semiconductor device of the present invention includes steps of;
 a resin layer forming step in which a face with electrodes of a semiconductor wafer having a plurality of semiconductor elements mounted thereon is coated with a resin layer which has a function of sealing the face; and
 a thinning step conducted subsequently, in which the back face of the semiconductor wafer is thinned.

The method of manufacturing the semiconductor device of the present invention further includes a process of forming a conductive section on the electrodes of the semiconductor wafer with a plurality of semiconductor elements in such a manner the conductive section contacts with the electrodes.

The method of manufacturing the semiconductor device of the present invention still further includes a process of cutting the semiconductor wafer having a plurality of semiconductor elements along boundaries of each semiconductor element.

In the thinning process, at least one method selected from a mechanical thinning method, a chemical etching method and a plasma etching method is used.

The semiconductor devices of the present invention are manufactured by the foregoing manufacturing method.

According to the present invention, a face of a semiconductor wafer where electrodes are disposed is coated with a resin layer which seals the face with electrodes, and subsequently, the back face of the semiconductor wafer is thinned by machining. In other wards, the semiconductor wafer is reinforced by the resin layer while it is being thinned. Therefore, the semiconductor wafers can be evenly thinned. Further, since the protective sheets are not used, the semiconductor wafers are free of destruction or damage conventionally caused while the protective sheets are being removed. In the same manner, the semiconductor wafers do not suffer damage when the wafers are cut (divided) after the thinning process, since they are reinforced by the resin layer.

DESCRIPTION OF THE PREFERRED EMBODIMENTS

The First Preferred Embodiment

FIGS. 1 and 2 show process diagrams of the manufacturing method of the semiconductor device of the first preferred embodiment of the present invention. FIGS. 1 and 2 illustrate the manufacturing method of the semiconductor device in the order of process.

Figure 1A:
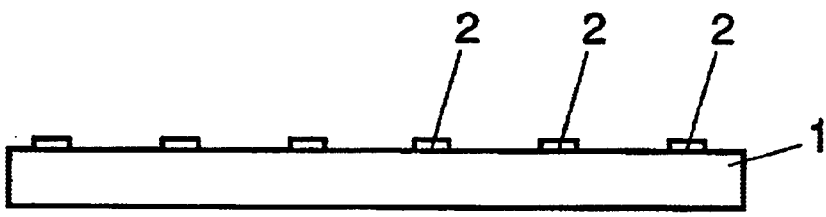
FIG. 1 shows a process diagram of a manufacturing method of a semiconductor device in accordance with a first preferred embodiment of the present invention.

In FIG. 1(a), disposed on the top surface of a semiconductor wafer 1 where a plurality of semiconductor elements is formed, are electrodes 2 for external connection. The semiconductor wafer 1 has a sufficient thickness (about 1 mm) to resist the thermal stress during the subsequent process of forming the resin layer.

Figure 1B:
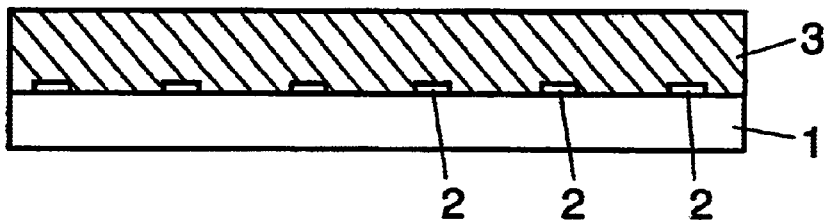

As FIG. 1(b) shows, a resin layer 3 is formed on the top surface of the semiconductor wafer 1 where the electrodes are formed. The resin layer 3 not only protects surface of the semiconductor wafer 1 but also functions as a sealing (passivation) resin even after the semiconductor elements are cut out from the semiconductor wafer 1 as independent semiconductor devices.

Thus, for the resin layer 3, resin materials superior in respect of sealing function to protect the semiconductor elements are selected. The sealing function here means a function to protect functional materials composing semiconductor elements especially those metals which compose electrodes such as aluminum, copper chromium and titanium, from dissolving, corrosion and electric erosion. In other words, resin materials used in the resin layer 3 must have an adequate humidity resistance, migration resistance, adequate strength against external force and electrical insulating properties as a sealer. Resins generally used to produce semiconductor devices can be used. To achieve even higher effects of the present invention, resins can be mixed with fillers such as silica, alumina, zirconia, quartz fibers, glass fibers and resin fibers to enhance mechanical strength. It is especially effective to add inorganic fine particles capable of absorbing ionic impurities to the resin in terms of protecting electrodes and preventing migration. One example of such inorganic particles is "IXE" (trade name) produced by the To a Gosei Chemical Industry Co., Ltd.

As for the methods of forming the resin layer, resin film adhering method or resin coating method can be used.

In the resin film coating method, resin materials such as epoxy resin or polyimide resin sheet is coated with an adhesive on one surface and adhered on the semiconductor wafer 1. Subsequently, the adhesive is thermally cured to tightly bond the resin film with the semiconductor wafer 1. When adhesives are not used, epoxy resin sheet of B-stage can be adhered and then thermally cured.

The function of the resin layer 3 is not limited to the protective function of the semiconductor devices. It also has effective function even after the semiconductor device is mounted on a circuit board. As it is mentioned later in this specification, the semiconductor device of the present invention used extremely thin semiconductor wafers. In general, semiconductor devices using thin semiconductor wafers are susceptible to stresses placed upon during and after mounted on a circuit board, and, in some cases, suffer breaking of connections between the circuit board and electrodes. Since the resin layer 3 cushions stress, very stable and reliable connection can be achieved as the semiconductor device of the present invention uses extremely thin semiconductor wafer.

In the resin coating method, liquid resin is coated at a predetermined thickness on the face of the semiconductor wafer 1 where electrodes are disposed, and cured. In this case, apart from the heat curing method, a photo-curing method, an electron beam curing method or other methods can be used.

Figure 1C:
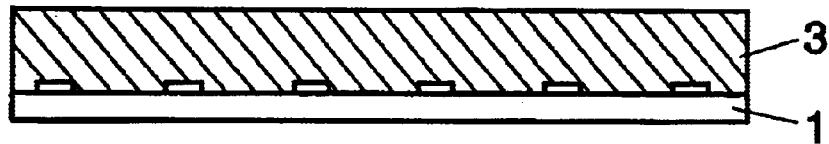

The semiconductor wafer 1 coated with the resin layer 3 is sent to a thinning process. In this process, as FIG. 1(c) shows, the back face of the semiconductor wafer 1, namely, the face without the resin layer 3, is ground and thinned by mechanical grinding to less than 300 μm preferably about 100 μm. In this grinding process, since the semiconductor wafer 1 is reinforced by the resin layer 3, damage or destruction of the semiconductor wafer 1 caused during grinding can be prevented. Further, as the semiconductor wafer 1 is reinforced by the resin layer 3, the semiconductor wafer 1 can be made as thin as less than 50 μm.

For this thinning process, apart from the mechanical grinding method, a plasma etching method and chemical etching method using chemicals can be used to etch and remove the surface layer on the back of the semiconductor wafer 1. For the purpose of precise chemical etching, a spin coater is effectively used.

Further, the back face of the semiconductor wafer 1 ground by the mechanical grinding method, can be subsequently treated with the plasma etching method. The plasma etching treatment can remove the layer with micro-cracks on the back face of the semiconductor wafer 1, and improve the strength of the semiconductor wafer 1.

In the plasma etching method, fluorine or chlorine derived gas is used as an etching gas. In the chemical etching of silicon wafer, mixed solution of fluoric acid and nitric acid may be used Further, the back face of the semiconductor wafer 1 ground by the mechanical grinding method can be subsequently treated with the plasma etching method or with chemical etching method. The plasma etching or chemical etching treatment can remove the layer with micro-cracks on the back face of the semiconductor wafer 1, and improve the strength of the semiconductor wafer 1.

Figure 2A:
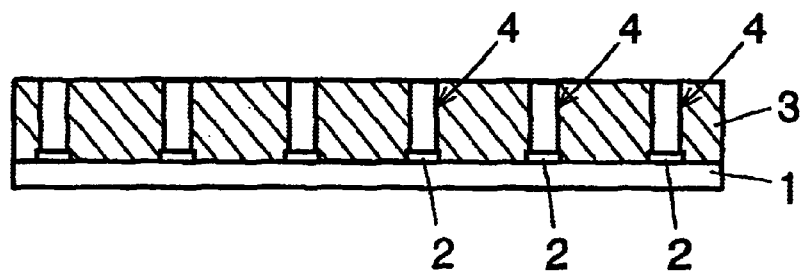
FIG. 2 shows a process diagram of the manufacturing method of the semiconductor device in accordance with the first preferred embodiment of the present invention.

As FIG. 2(a) shows, blind holes are formed on the resin layer 3 by a laser. By irradiating a laser light on the positions corresponding to the electrodes 2, blind holes 4 which are open to the surface of the electrodes 2 are formed on the resin layer 3. Applicable lasers include a carbon dioxide laser, a YAG laser and excimer lasers. The carbon dioxide laser is capable of making holes only on the resin layer without affecting the electrodes while the excimer lasers are advantageous in terms of forming fine holes.

Figure 2B:
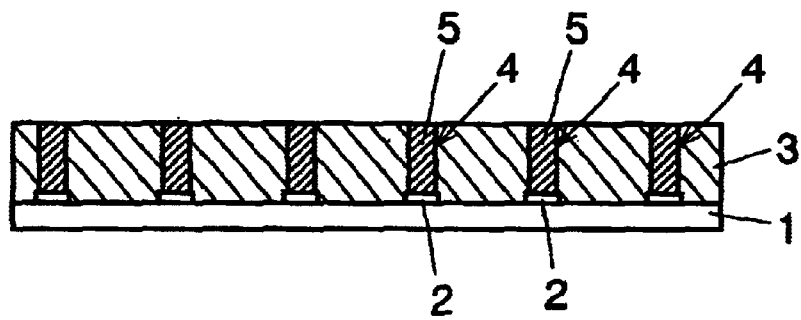

Subsequently as FIG. 2(b) shows, the blind holes 4 are filled with a solder paste 5, a conductive paste.

Figure 2C:
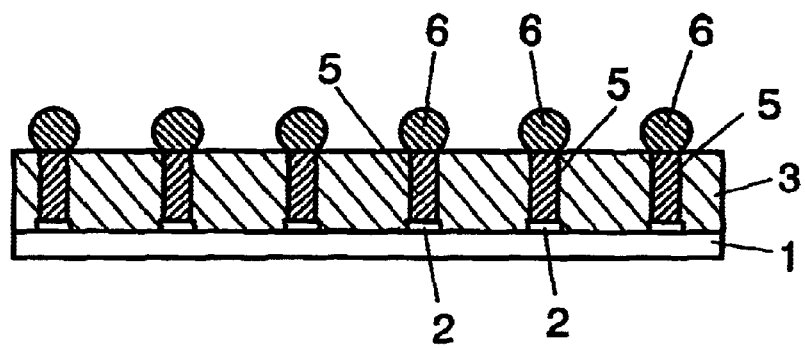
Figure 2D:
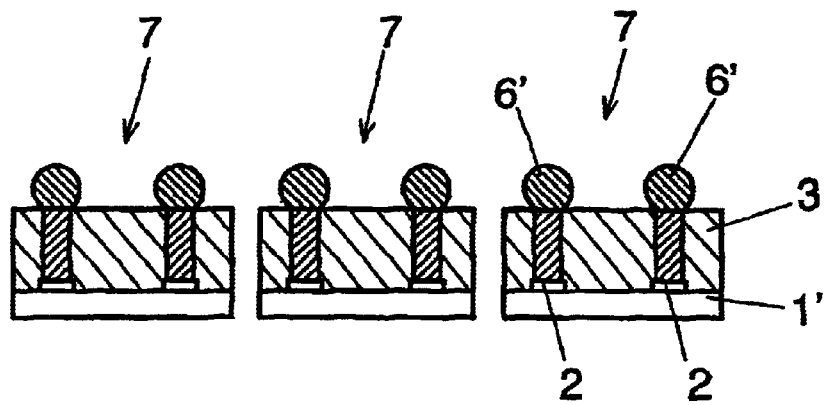

On the solder paste 5 which fills the blind holes 4, solder balls 6 are then mounted as shown in FIG. 2(c). After this step, the semiconductor wafer 1 is heated in a reflow process to melt the solder paste 5 and the solder balls 6. After molten solder is solidified, protrusive solder bumps 6' connected to the electrodes 2 are formed on the resin layer 3.

After forming solder bumps, the semiconductor wafer 1 is sent to a cutting process where it is cut along the boundaries of each semiconductor element 1' which composes the semiconductor wafer 1, to complete a semiconductor device 7. The semiconductor device 7 manufactured in the manner described above has a face with electrodes sealed by the resin layer 3.

Compared with similar semiconductor devices manufactured by a conventional method, the semiconductor device 7 manufactured by the method of this embodiment has superior properties described below.

(1) Since the semiconductor wafer 1 is ground and thinned after its face with electrodes is sealed with the resin layer 3, the semiconductor wafer 1 is reinforced more firmly compared with the conventional method in which protective sheets are used. Thus, the semiconductor wafer 1 can be ground even thinner than the conventional manufacturing method, without causing any damage.

(2) The process to remove the protective sheets after the thinning process required in the conventional methods is no longer necessary, therefore, the semiconductor wafer 1 is free of damage caused by the external force placed upon during the removal of the protective sheet as well as during cutting. Therefore, a semiconductor device with superior reliability can be achieved. Further, since the consumable protective sheets are not used, problems of waste treatment caused by disposal of protective sheets after use do not exist.

The Second Preferred Embodiment

Figure 3A:
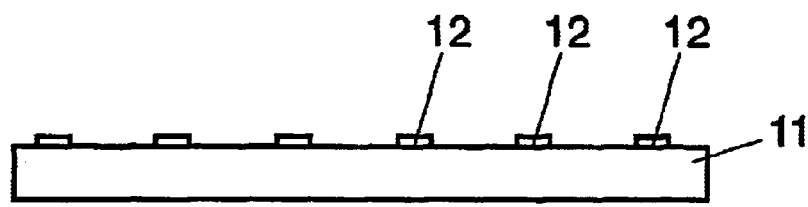
FIG. 3 shows a process diagram of a manufacturing method of a semiconductor device in accordance with a second preferred embodiment of the present invention.
Figure 3B:
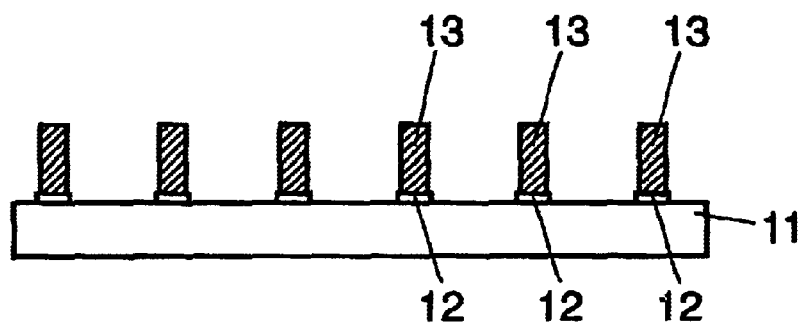
Figure 3C:
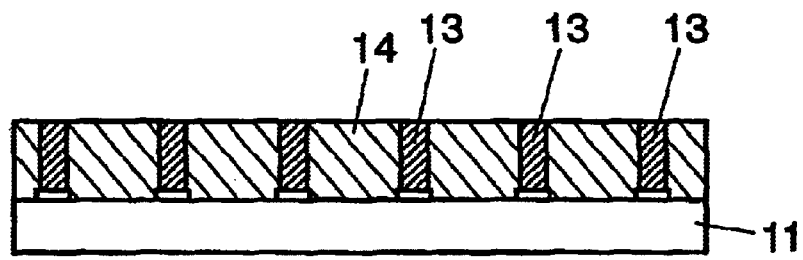

FIGS. 3 and 4 show process diagrams of the manufacturing method of the semiconductor device of the second preferred embodiment of the present invention. FIGS. 3 and 4 illustrate the manufacturing method of the semiconductor in the order of process.

In FIG. 3(a), similar to the semiconductor wafer of the first preferred embodiment, a plurality of semiconductor elements is disposed on a semiconductor wafer 11. On the top of the semiconductor wafer 11 are electrodes 12 for external connection. As FIG. 3(b) shows, a conductive section 13 is formed on the electrodes 12 for external connection. The conductive section 13 is formed, for example, by laminating metallic plating layers on the top face of the electrodes 12. The semiconductor wafer 11 having the conductive section 13 formed thereon is sealed with resin in a similar manner to the first preferred embodiment. In this embodiment, on the surface of the semiconductor wafer 11 where the electrodes 12 and the conductive sections 13 are formed, a resin layer 14 with sealing function is formed. For the resin layer 14, similar materials for the resin layer 3 in the first preferred embodiment are used.

Figure 4A:
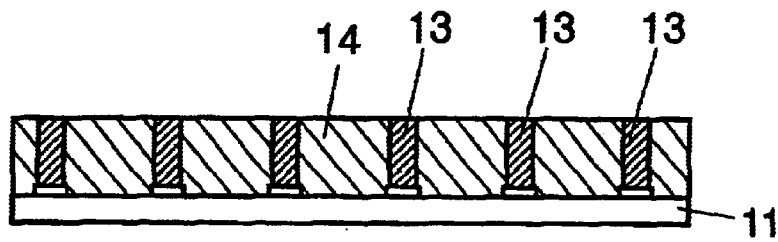
FIG. 4 shows a process diagram of the manufacturing method of the semiconductor device in accordance with the second preferred embodiment of the present invention.

The semiconductor wafer 11 coated with the resin layer 14 is sent to a thinning process. In this process, as FIG. 4(a) shows, the back face of the semiconductor wafer 11 is ground and thinned in a grinding process in a similar manner to the first preferred embodiment. In this grinding process, since the semiconductor wafer 11 is reinforced by the resin layer 14, damage or destruction of the semiconductor wafer 11 caused during grinding can be prevented.

For this thinning process, apart from the mechanical grinding method, plasma etching method or chemical etching method can be used to remove the surface layer on the back face of the semiconductor wafer 11. Further, the back face of the semiconductor wafer 11 ground by the mechanical grinding method can be subsequently treated with the plasma etching method.

Figure 4B:
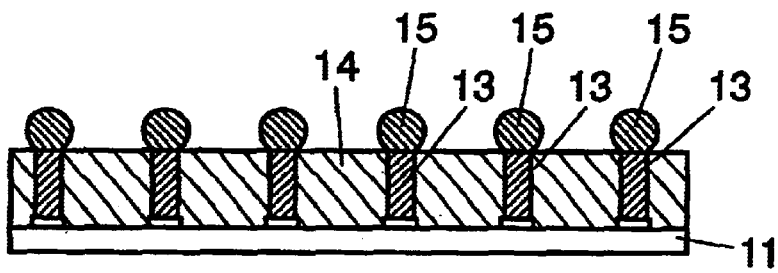
Figure 4C:
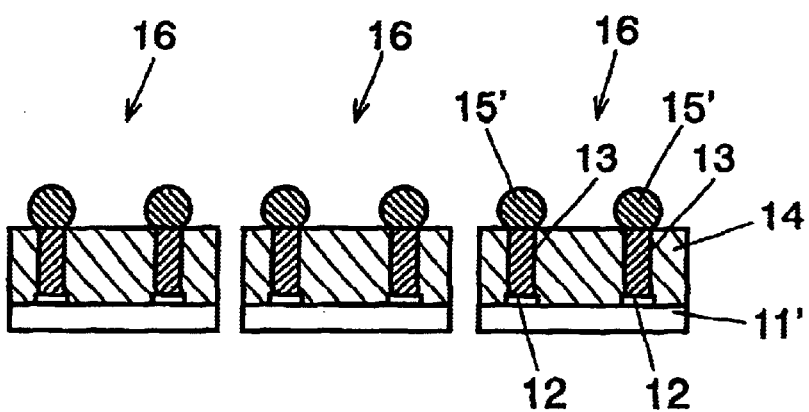

On the conductive section 13, solder balls 15 are mounted as shown in FIG. 4(b). After this step, the semiconductor wafer 11 is sent to and heated in a reflow process to melt the solder balls 15 and connect them with the conductive section 13. When molten solder is solidified, protruding solder bumps 15' (shown in FIG. 4(c)) are formed on the resin layer 14.

After forming the solder bumps, the semiconductor wafer 11 is cut into pieces along the boundaries of each semiconductor element 11' to complete a semiconductor 16 in which the resin layer 14 seals the face where the electrodes for external connection are disposed. The semiconductor device 16 has superior properties similar to the semiconductor device 7 of the first preferred embodiment.

In the second preferred embodiment, the conductive section 13 is formed by plating, however, it can be formed by wire bumps produced by wire bonding or ball bumps produced by connecting metallic balls. The wire bumps and ball bumps are advantageous over the plating in terms of cost of forming the conductive section 13.

The Third Preferred Embodiment

FIGS. 5 and 6 show process diagrams of the manufacturing method of the semiconductor device of the second preferred embodiment of the present invention. FIGS. 5 and 6 illustrate the manufacturing method of the semiconductor in the order of process.

Figure 5A:
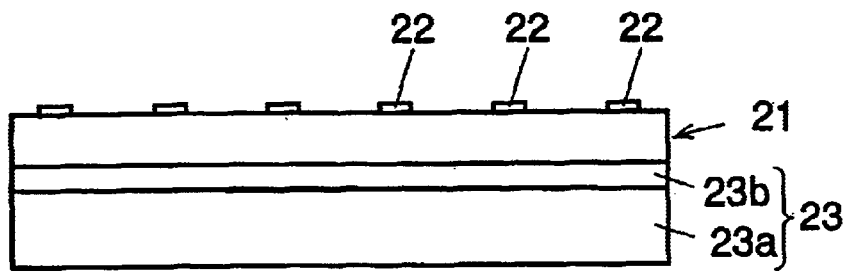
FIG. 5 shows a process diagram of a manufacturing method of a semiconductor device in accordance with a third preferred embodiment of the present invention.

In FIG. 5(a), electrodes 22 for external connection are disposed on the top surface of a semiconductor wafer 21 where a plurality of semiconductor elements is formed in a similar manner to the semiconductor wafer of the first preferred embodiment. A protective sheet 23 is bonded on the bottom surface of the semiconductor wafer 21. The protective sheet 23 is prepared such that a pressure sensitive adhesive layer 23b is coated on a resin film 23a. When adhered on the semiconductor wafer 21, the protective sheet 23 reinforces it.

Figure 5B:
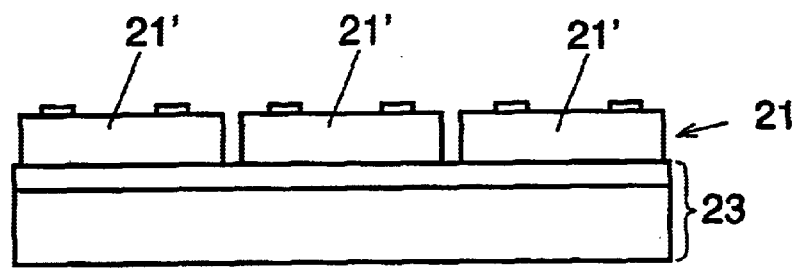

The semiconductor wafer 21 is sent to a cutting process while being reinforced by the protective sheet 23, and cut along the boundaries of each semiconductor element 21' as shown in FIG. 5(b). As a result of this step, the semiconductor wafer 21 becomes such that each semiconductor element 21' is connected by the protective sheet 23.

Figure 5C:
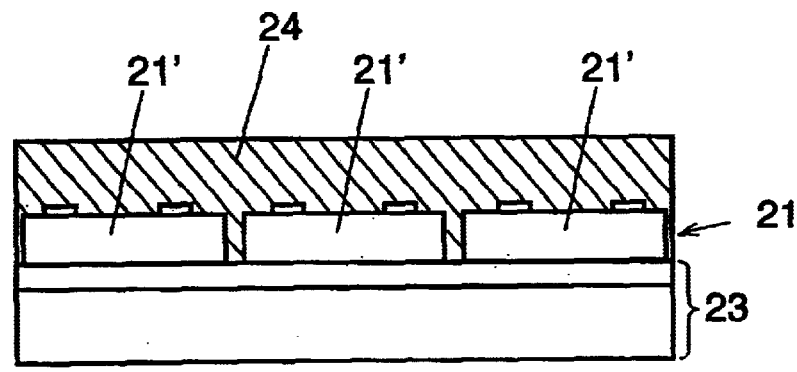

In this condition, a resin layer 24 is formed on the face of the connected semiconductor wafer 21' (hereinafter, connected semiconductor wafer) where electrodes are disposed as shown in FIG. 5(c). As is the case with the resin layers 3 and 14 respectively of the first and second preferred embodiment, the resin layer 24 has a function of sealing the face with the electrodes.

Figure 5D:
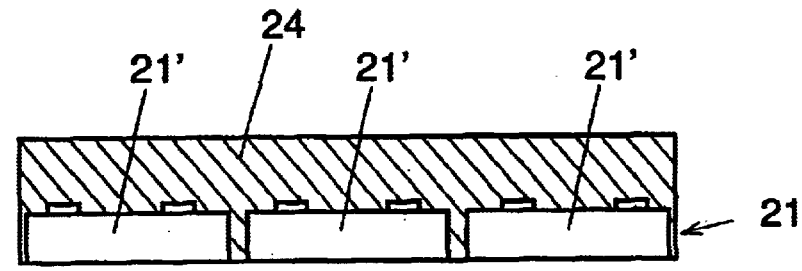
Figure 5E:
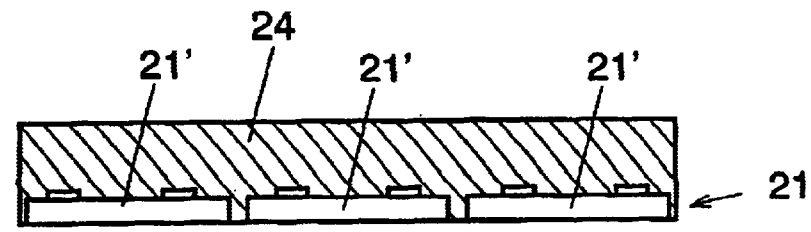

Subsequently, the protective sheet 23 is removed from the connected semiconductor wafer on which the resin layer 24 is formed. With this step, the face of the connected semiconductor wafer where the electrodes are disposed, is sealed with the resin layer 24 as shown in FIG. 5(d). The connected semiconductor wafer is sent to a thinning process in this condition, and the back face of each semiconductor element 21' is ground and thinned by a mechanical grinding process. In this grinding process, since the semiconductor elements 21' are reinforced by the resin layer 24, damage or destruction caused by the stress during grinding can be prevented. For this thinning process, similar to the first preferred embodiment, the plasma etching method or chemical etching method can be used to remove the surface layer on the back of the semiconductor wafer 21 other than the mechanical grinding method. Further, the back face of the semiconductor wafer 21 ground by the mechanical grinding method, can be subsequently treated with the plasma etching method.

Figure 6A:
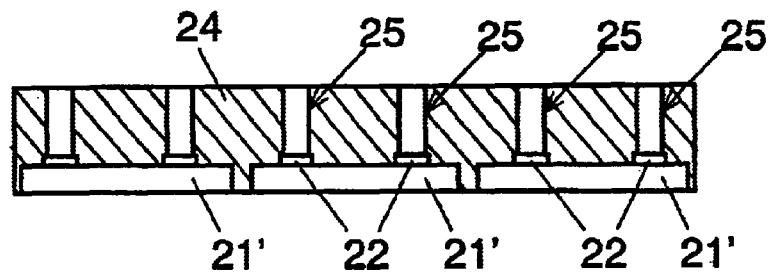
FIG. 6 shows a process diagram of the manufacturing method of the semiconductor device in accordance with the third preferred embodiment of the present invention.
Figure 6B:
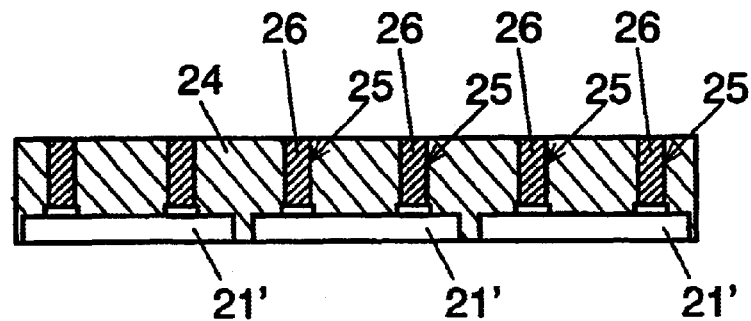
Figure 6C:
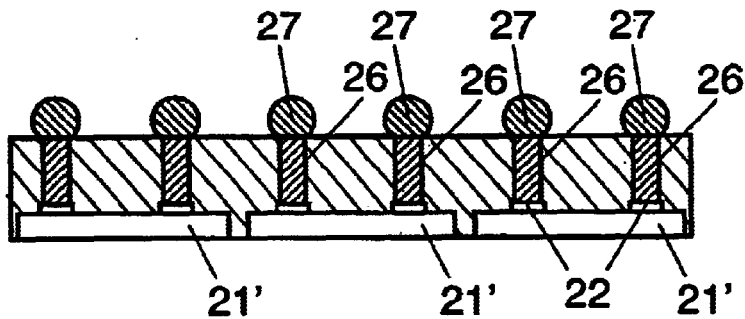

The connected semiconductor wafer is then sent to a blind hole forming process. Similar to the first preferred embodiment, in this process, blind holes 25 which reaches to the surface of the electrodes 22 are formed on the resin layer 24 at the positions corresponding to the electrodes 22 as shown in FIG. 6(a). Subsequently, as FIG. 6(b) shows, the blind holes 25 are filled with a solder paste 26. On the solder paste 26, solder balls 27 are mounted as shown in FIG. 6(c). After this step, the connected semiconductor wafer is heated in a reflow process, the solder paste 26 and the solder balls 27 are melted and protruding solder bumps 27' which are connected to the electrodes 22 are formed on the resin layer 24.

Figure 6D:
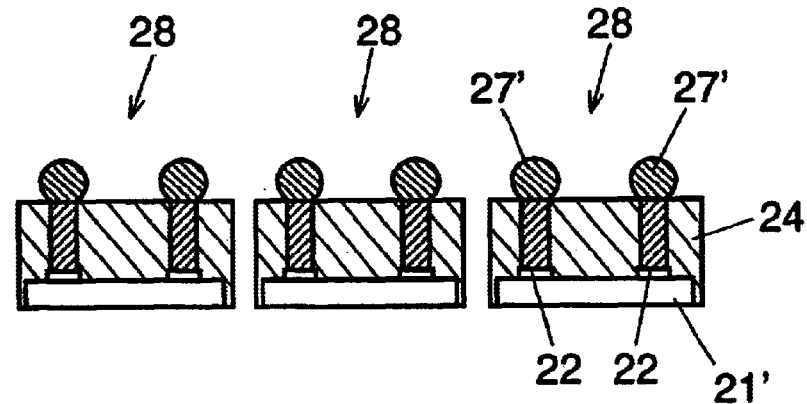

After forming solder bumps, the connected semiconductor wafer is sent to a cutting process where the resin layer 24 is cut along the boundaries of each semiconductor element 21' as shown in FIG. 6(d) to complete a semiconductor device 28 in which face with electrodes for external connection is sealed with the resin layer 24. The semiconductor device 28 also enjoys superior properties similar to the semiconductor device 7 of the first preferred embodiment.

As described in the first, second and third preferred embodiments, according to the present invention, after the resin layer with sealing function is formed on the face of the semiconductor wafer where electrodes are disposed, the back face of the semiconductor wafer is ground and thinned. This method has the following effects.

(1) Even and thin semiconductor elements can be achieved since the semiconductor wafer is adequately reinforced during the thinning process.

(2) Since protective sheets do not have to be removed after the thinning process, associated destruction of or damage to the semiconductor wafers does not occur.

(3) Since disposable protective sheets are not required, not only manufacturing cost can be reduced but also, with no waste being generated, stress placed on the environment can be eliminated.

According to the present invention, reliable semiconductor devices can be produced environmentally soundly at low cost.

What is claimed is:

1. A semiconductor device comprising:
   a semiconductor substrate comprising a face having a plurality of semiconductor element electrodes located thereon, and an opposing back face without microcracks therein, said substrate having a thickness not more than 300 $\mu$m; and
   a resin layer located on said face and comprising at least one of silica, alumina, zirconia, quartz fiber, glass fiber resin fiber and inorganic particles capable of absorbing ionic impurities; said resin layer comprising at least one blind hole having a conductor section located therein, the conductor section connected to one of the semiconductor element electrodes; and
   an electrode for external connection connected to the conductor section.

2. The semiconductor device of claim 1, wherein the conductor section comprises solidified conductive paste.

3. The semiconductor device of claim 1, wherein the conductor section comprises solder.

4. The semiconductor device of claim 1, wherein the electrode for external connection comprises solder.

5. The semiconductor device of claim 1, wherein the electrode for external connection is a solder bump.

* * * * *